United States Patent
Liu et al.

(10) Patent No.: US 10,833,153 B2
(45) Date of Patent: Nov. 10, 2020

(54) SWITCH WITH LOCAL SILICON ON INSULATOR (SOI) AND DEEP TRENCH ISOLATION

(71) Applicant: GLOBALFOUNDRIES INC., Grand Cayman (KY)

(72) Inventors: Qizhi Liu, Lexington, MA (US); Steven M. Shank, Jericho, VT (US); John J. Ellis-Monaghan, Grand Isle, VT (US); Anthony K. Stamper, Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/703,220

(22) Filed: Sep. 13, 2017

(65) Prior Publication Data

US 2019/0081138 A1   Mar. 14, 2019

(51) Int. Cl.
| | |
|---|---|
| *H01L 29/06* | (2006.01) |
| *H01L 27/12* | (2006.01) |
| *H01L 29/10* | (2006.01) |
| *H01L 21/02* | (2006.01) |
| *H01L 21/84* | (2006.01) |
| *H01L 21/764* | (2006.01) |
| *H01L 21/762* | (2006.01) |
| *H01L 29/786* | (2006.01) |

(52) U.S. Cl.
CPC .... *H01L 29/0649* (2013.01); *H01L 21/02532* (2013.01); *H01L 21/764* (2013.01); *H01L 21/76283* (2013.01); *H01L 21/84* (2013.01); *H01L 27/1203* (2013.01); *H01L 29/1095* (2013.01); *H01L 29/78606* (2013.01); *H01L 29/78654* (2013.01)

(58) Field of Classification Search
CPC ........... H01L 29/0649; H01L 21/76224; H01L 21/764; H01L 21/7682; H01L 27/1203; H01L 21/76264; H01L 21/76289
See application file for complete search history.

(56) References Cited

U.S. PATENT DOCUMENTS

| | | | |
|---|---|---|---|
| 4,888,300 A | 12/1989 | Burton | |
| 5,844,299 A | 12/1998 | Merill et al. | |
| 5,869,374 A | 2/1999 | Wu | |
| 5,943,581 A | 8/1999 | Lu et al. | |

(Continued)

FOREIGN PATENT DOCUMENTS

| | | |
|---|---|---|
| JP | 2009099841 | 5/2009 |
| TW | 201711190 | 3/2017 |

OTHER PUBLICATIONS

Taiwanese Office Action and Search Report in related TW Application No. 106132441 dated Dec. 7, 2018, 14 pages.

(Continued)

*Primary Examiner* — John A Bodnar
(74) *Attorney, Agent, or Firm* — Anthony Canale; Andrew M. Calderon; Roberts Calderon Safran & Cole, P.C.

(57) ABSTRACT

The present disclosure relates to semiconductor structures and, more particularly, to a switch with local silicon on insulator (SOI) and deep trench isolation structures and methods of manufacture. The structure a structure comprises an air gap located under a device region and bounded by an upper etch stop layer and deep trench isolation structures.

8 Claims, 3 Drawing Sheets

(56) References Cited

U.S. PATENT DOCUMENTS

| | | | |
|---|---|---|---|
| 5,949,144 A | 9/1999 | Delgado et al. | |
| 5,972,758 A | 10/1999 | Liang | |
| 6,093,330 A | 7/2000 | Chong et al. | |
| 6,093,599 A | 7/2000 | Lee et al. | |
| 6,057,202 A | 9/2000 | Chen et al. | |
| 6,140,197 A | 10/2000 | Chu et al. | |
| 6,255,704 B1* | 7/2001 | Iwata | H01L 21/82385 257/401 |
| 6,258,688 B1 | 7/2001 | Tsai | |
| 6,274,920 B1 | 8/2001 | Park et al. | |
| 6,337,499 B1 | 1/2002 | Werner | |
| 6,376,291 B1 | 4/2002 | Barlocchi et al. | |
| 6,518,144 B2 | 2/2003 | Nitta et al. | |
| 6,518,147 B1 | 2/2003 | Villa et al. | |
| 6,551,944 B1 | 4/2003 | Fallica et al. | |
| 6,670,257 B1 | 12/2003 | Barlocchi et al. | |
| 6,720,229 B2 | 4/2004 | Norström et al. | |
| 6,833,079 B1 | 12/2004 | Giordani | |
| 6,835,631 B1 | 12/2004 | Zhen et al. | |
| 6,928,879 B2 | 8/2005 | Partridge et al. | |
| 6,992,367 B2 | 1/2006 | Erratico et al. | |
| 7,009,273 B2 | 3/2006 | Inoh et al. | |
| 7,053,747 B2 | 5/2006 | Joodaki | |
| 7,279,377 B2 | 10/2007 | Rueger et al. | |
| 7,294,536 B2 | 11/2007 | Villa et al. | |
| 7,326,625 B2 | 2/2008 | Jeong et al. | |
| 7,354,786 B2 | 4/2008 | Benzel et al. | |
| 7,427,803 B2 | 9/2008 | Chao et al. | |
| 7,662,722 B2 | 2/2010 | Stamper et al. | |
| 7,678,600 B2 | 3/2010 | Villa et al. | |
| 7,906,388 B2 | 3/2011 | Sonsky | |
| 8,203,137 B2 | 6/2012 | Cho et al. | |
| 8,319,278 B1 | 11/2012 | Zeng et al. | |
| 8,575,690 B1 | 11/2013 | Hsieh | |
| 8,652,951 B2 | 2/2014 | Huang et al. | |
| 8,674,472 B2 | 3/2014 | Botula et al. | |
| 8,907,408 B2 | 12/2014 | Sedlmaier et al. | |
| 8,927,386 B2 | 1/2015 | Wu et al. | |
| 9,029,229 B2 | 5/2015 | Adkisson et al. | |
| 9,048,284 B2 | 6/2015 | McPartlin et al. | |
| 9,059,252 B1* | 6/2015 | Liu | H01L 21/7682 |
| 9,159,817 B2 | 10/2015 | Camillo-Castillo et al. | |
| 9,177,866 B2 | 11/2015 | Davies | |
| 9,224,858 B1 | 12/2015 | Camillo-Castillo et al. | |
| 9,324,846 B1 | 4/2016 | Camillo-Castillo et al. | |
| 9,349,793 B2 | 5/2016 | Jaffe et al. | |
| 9,355,972 B2 | 5/2016 | Dunn et al. | |
| 9,570,564 B2 | 2/2017 | Alperstein et al. | |
| 9,640,538 B2 | 5/2017 | Liu et al. | |
| 9,722,057 B2 | 8/2017 | Camillo-Castillo et al. | |
| 9,726,547 B2 | 8/2017 | Liu et al. | |
| 9,917,186 B2 | 3/2018 | Laven et al. | |
| 10,062,757 B2 | 8/2018 | Toia et al. | |
| 2002/0043686 A1* | 4/2002 | Bolam | H01L 21/743 257/349 |
| 2002/0195681 A1 | 12/2002 | Melendez et al. | |
| 2003/0067014 A1 | 4/2003 | Tsuruta et al. | |
| 2004/0180510 A1 | 9/2004 | Ranade et al. | |
| 2004/0217434 A1 | 11/2004 | Lee et al. | |
| 2004/0217443 A1 | 11/2004 | Davies | |
| 2005/0176222 A1* | 8/2005 | Ogura | H01L 21/26533 438/514 |
| 2006/0091453 A1 | 5/2006 | Matsuda et al. | |
| 2006/0138541 A1 | 6/2006 | Nakamura et al. | |
| 2006/0228864 A1 | 10/2006 | Chen et al. | |
| 2007/0181920 A1 | 8/2007 | Renna et al. | |
| 2007/0238250 A1* | 10/2007 | Zhang | H01L 21/76254 438/262 |
| 2008/0044979 A1 | 2/2008 | Wells et al. | |
| 2008/0073747 A1 | 3/2008 | Chao et al. | |
| 2009/0072351 A1* | 3/2009 | Meunier-Beillard | H01L 21/76264 257/615 |
| 2009/0101997 A1 | 4/2009 | Lammel et al. | |
| 2010/0035403 A1* | 2/2010 | Brown | H01L 21/76224 438/422 |
| 2010/0059854 A1 | 3/2010 | Lin et al. | |
| 2010/0109120 A1 | 5/2010 | Fucsko et al. | |
| 2010/0117136 A1 | 5/2010 | Yasuda | |
| 2012/0028401 A1 | 2/2012 | De Munck et al. | |
| 2012/0038024 A1 | 2/2012 | Botula et al. | |
| 2012/0211805 A1 | 8/2012 | Winkler et al. | |
| 2012/0292700 A1 | 11/2012 | Khakitirooz et al. | |
| 2013/0043490 A1 | 2/2013 | Sorada | |
| 2013/0320459 A1* | 12/2013 | Shue | H01L 21/76283 257/392 |
| 2014/0042595 A1 | 2/2014 | Schulze et al. | |
| 2014/0097402 A1 | 4/2014 | Wang et al. | |
| 2014/0151852 A1 | 6/2014 | Adkisson et al. | |
| 2014/0252481 A1 | 9/2014 | Flachowsky et al. | |
| 2014/0353725 A1 | 12/2014 | Adkisson et al. | |
| 2015/0179755 A1 | 6/2015 | Rooyackers et al. | |
| 2015/0194416 A1* | 7/2015 | Cheng | H01L 27/0207 257/368 |
| 2015/0318665 A1 | 11/2015 | Liang | |
| 2015/0348825 A1 | 12/2015 | Hebert | |
| 2016/0372592 A1 | 12/2016 | Cho | |
| 2017/0110574 A1 | 4/2017 | LaVen et al. | |
| 2017/0170056 A1 | 6/2017 | Jaffe et al. | |
| 2018/0083098 A1* | 3/2018 | Goktepeli | H01L 29/0649 |
| 2019/0013382 A1 | 1/2019 | Stamper et al. | |

OTHER PUBLICATIONS

Hashimoto et al., "A Study on Suppressing Crosstalk Through a Thick SOI Substrate and Deep Trench Isolation", IEEE, Jul. 2013, vol. 1, No. 7, 7 pages.

Ohguro et al., "High performance digital-analog mixed device on a Si substrate with resistivity beyond 1 kΩ cm", IEEE, 2000, 4 pages.

Office Action in related U.S. Appl. No. 15/645,655 dated Jul. 19, 2018, 17 pages.

Response to Office Action in related U.S. Appl. No. 15/645,655, filed Oct. 18, 2018, 12 pages.

Taiwanese Office Action in related U.S. Appl. No. 106132441 dated Jul. 16, 2018, 10 pages.

Taiwanese Office Action in related U.S. Appl. No. 107112403 dated Oct. 18, 2018, 9 pages.

Office Action in related U.S. Appl. No. 15/876,727 dated Jan. 11, 2019, 10 pages.

Taiwanese Office Action in TW Application No. 106132441 dated Jun. 4, 2019, 10 pages.

Notice of Allowance in U.S. Appl. No. 15/876,727 dated Jun. 12, 2019, 9 pages.

Final Office Action in related U.S. Appl. No. 15/645,655 dated Jan. 31, 2019, 16 pages.

Notice of Allowance in related TW Application No. 107112403 dated Mar. 27, 2019, 4 pages.

Response to Office Action in related U.S. Appl. No. 15/876,727 dated Apr. 11, 2019, 7 pages.

Response to Final Office Action in related U.S. Appl. No. 15/645,655 dated Mar. 20, 2019, 11 pages.

Taiwanese Office Action and Search Report in related TW Application No. 106132441 dated Mar. 3, 2020, 10 pages.

Office Action in U.S. Appl. No. 16/241,441 dated May 12, 2020, 8 pages.

Office Action in U.S. Appl. No. 16/575,675 dated Jun. 30, 2020, 11 pages.

DE Office Action in DE Application No. 102018222690.3 dated May 28, 2020, 9 pages.

* cited by examiner

SWITCH WITH LOCAL SILICON ON INSULATOR (SOI) AND DEEP TRENCH ISOLATION

FIELD OF THE INVENTION

The present disclosure relates to semiconductor structures and, more particularly, to a switch with local silicon on insulator (SOI) and deep trench isolation structures and methods of manufacture.

BACKGROUND

Radio frequency (RF) devices are used in many different types of communication applications. For example, RF devices can be used in cellular telephones with wireless communication components such as switches, MOSFETs, transistors and diodes.

As cellular telephones become more complex, there is an increasing need to provide higher performance for the wireless communication components. RF devices are typically manufactured on high resistivity silicon wafers or substrates to achieve the needed rf linearity. For example, state-of-the-art trap rich silicon on insulator (SOI) high resistivity substrates offer excellent vertical isolation and linearity. More specifically, high resistivity p-Si handle wafers provide improved linearity by reducing substrate carrier induced harmonics. However, high resistivity depletion regions can extend deep into the substrate, e.g., 5 μm to 50 μm, resulting in leakage between neighboring devices and harmonic distortion.

Triple wells can block depletion regions from merging, e.g., depletion regions of neighboring p-wells, and can also prevent DC substrate current from interacting with the p-well region and the FET. However, merged triple well depletion regions can result in harmonic distortion due to the coupling between the n-type triple well regions. Triple well depletion regions also add non-linear capacitance with respect to varying voltage which results in additional harmonic distortion.

SUMMARY

In an aspect of the disclosure, a structure comprises an air gap located under a device region and bounded by an upper etch stop layer and deep trench isolation structures.

In an aspect of the disclosure, a structure comprises: a substrate material; an etch stop layer on the substrate material; an epitaxial material on the etch stop layer; a device region over the epitaxial material, the device region including one or more devices; a deep trench isolation structure surrounding the device region, extending into the substrate material; and a cavity under the device region and bounded by the etch stop layer on a top and the deep trench isolation structure on all sides.

In an aspect of the disclosure, a method comprises: embedding a SiGe etch stop layer between a substrate material and an epitaxial material on the SiGe etch stop layer; forming a cavity in the substrate material through vent vias extending below the SiGe etch stop layer, the cavity extending under the SiGe etch stop layer and coincident with a device region of the epitaxial material; and forming a deep trench isolation structure surrounding the device region, extending into the substrate material and on all sides of the cavity.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a switch with local silicon on insulator (SOI) and deep trench isolation structures and methods of manufacture. More specifically, the structure described herein includes an air gap (cavity) located under a device region, where the air gap is bounded by an etch stop layer at the top and deep trench isolation on all sides. Advantageously, such structures used with RF switches improves leakage currents, noise, and linearity (harmonics) for devices built on bulk substrates and high resistivity substrates.

In more specific embodiments, the structures described herein include an air gap (or cavity) located under a device region, which is bounded by an etch stop layer (e.g., SiGe) at the top, and deep trench isolation structures which entirely surround the air gap on all sides and extend below the depth of the air gap. For example, in embodiments, the deep trench isolation structures can be greater than 5 μm. In embodiments, the etch stop layer (e.g., SiGe) can be formed on a high resistivity wafer, where the etch stop layer can be used to form the air gap (e.g., cavity) extending under p-wells (and/or n-wells) and gate structures (transistors or other devices). In embodiments, a vent via can be located on an inside portion of the deep trench isolation structure to form the air gaps, which can be formed preferably at the first metal layer, e.g., M1 layer. In optional embodiments, the air gap can have oxide sidewalls.

The switch of the present disclosure can be manufactured in a number of ways using a number of different tools. In general, though, the methodologies and tools are used to form structures with dimensions in the micrometer and nanometer scale. The methodologies, i.e., technologies, employed to manufacture the switch of the present disclosure have been adopted from integrated circuit (IC) technology. For example, the structures are built on wafers and are realized in films of material patterned by photolithographic processes on the top of a wafer. In particular, the fabrication of the switch uses three basic building blocks: (i) deposition of thin films of material on a substrate, (ii) applying a patterned mask on top of the films by photolithographic imaging, and (iii) etching the films selectively to the mask.

Figure 1:
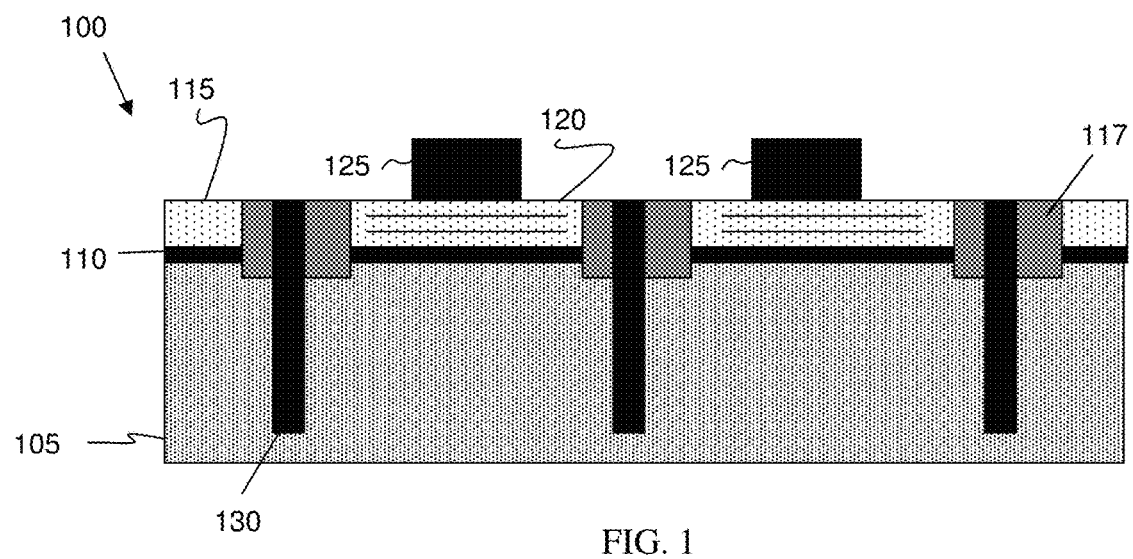
FIG. 1 shows a structure and respective fabrication processes in accordance with aspects of the present disclosure.

FIG. 1 shows a structure and respective fabrication processes in accordance with aspects of the present disclosure. In particular, the structure 100 includes a substrate 105 composed of any suitable material including, but not limited to, Si, SiGe, SiGeC, SiC, GaAs, InAs, InP, and other III/V or II/VI compound semiconductors. In embodiments, the substrate 105 is a high resistivity wafer as should be understood by those of skill in the art such that no further explanation is required herein.

An etch stop layer 110 is formed on the substrate 105. In embodiments, the etch stop layer 110 can be, e.g., SiGe. In alternate embodiments, the etch stop layer 110 can be any semiconductor material that is selective to the substrate 105 during etching processes to form an air gap (or cavity). The etch stop layer 110 can be deposited using any conventional deposition method, e.g., chemical vapor deposition (CVD) processes. An epitaxial semiconductor layer 115 is grown on the etch stop layer 110. In this way, the etch stop layer 110 will be embedded between the substrate 105 and the epitaxial semiconductor layer 115. The epitaxial semiconductor layer 115 can have a thickness of about 0.1 µm to about 5.0 µm, and preferably about 0.4 µm. In other embodiments, the epitaxial semiconductor layer 115 can have a thickness of about 600 Å to about 1200 Å.

Still referring to FIG. 1, in embodiments, shallow trench isolation regions 117 are formed in the substrate 105, and more preferably extending to below the etch stop layer 110. The shallow trench isolation regions 117 can be formed using conventional lithography, etching and deposition methods known to those of skill in the art. In particular, a resist formed over the epitaxial semiconductor layer 115 is exposed to energy (light) to form a pattern (opening). An etching process with a selective chemistry, e.g., reactive ion etching (RIE), will be used to form one or more trenches into the substrate 105 through the openings of the resist. The resist can then be removed by a conventional oxygen ashing process or other known stripants. Following the resist removal, insulator material, e.g., $SiO_2$ material, can be deposited by any conventional deposition processes, e.g., chemical vapor deposition (CVD) processes. Any residual material on the surface of the epitaxial semiconductor layer 115 can be removed by conventional chemical mechanical polishing (CMP) processes. The shallow trench isolation regions 117 can be about 0.2 µm to 1.0 µm deep, with a preference for about 0.3 µm depth as an example.

Following the formation of the shallow trench isolation regions 117, wells 120 can be formed in the epitaxial semiconductor layer 117 using conventional ion implantation or doping processes. In embodiments, the wells can be either p-doped wells or n-doped wells, depending on the device type, e.g., NFET or PFET, respectively. In embodiments, the p-well is preferably deeper than the etch stop layer 110, e.g., extends into the etch stop layer 110; whereas, the n-well can be shallower than the etch stop layer 110. By way of example, the wells 120 can have a depth or thickness of about 0.05 µm to 1 µm.

Gate structures 125 (with source and drain regions) are formed over the wells using conventional CMOS processes, e.g., deposition of materials and patterning processes, known to those of skill in the such that no further explanation is required. In embodiments, the gate structures 125 are representative of FET switches and/or other CMOS devices, e.g., NFET and/or PFET devices with a dual or triple well configuration. In further embodiments, the gate structures 125 can be one or more FET stacks, one or more FET fingers, an H-gate, a T-Body, or isolated body contacts, as several additional examples.

A silicide process can be performed on the gate structures 125, e.g., including on source and drain regions, which is used in combination with future contact formation processes. As should be understood by those of skill in the art, the silicide process begins with deposition of a thin transition metal layer, e.g., nickel, cobalt or titanium, over fully formed and patterned semiconductor devices (e.g., doped or ion implanted source and drain regions and respective devices). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active regions of the device. It should be understood by those of skill in the art that silicide contacts will not be required on the devices, when a gate structure is composed of a metal material.

FIG. 1 further shows the formation of deep trench isolation structures 130 extending into the substrate 105, surrounding the gate structures 125. In embodiments, the deep trench isolation structures 130 can be formed using conventional etching processes for deep trenches, e.g., conventional CMOS lithography, etching and deposition processes. In embodiments, the deep trench isolation structures 130 can have a depth of about 65 µm, which provides isolation from well charges that produce harmonic distortion. The deep trench isolation structures 130 can be lined with oxide and filled with other insulator material, or filled completely with an oxide material.

Figure 2:
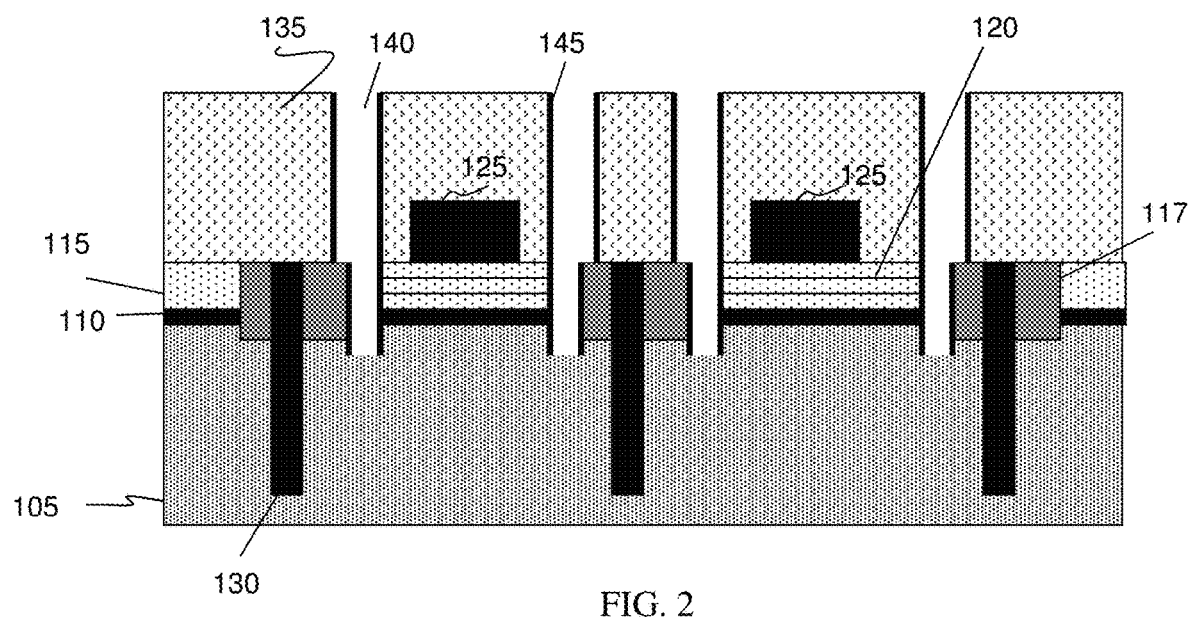
FIG. 2 shows a structure with lined vent vias, amongst other features, and respective fabrication processes in accordance with additional aspects of the present disclosure.

In FIG. 2, vent vias 140 are formed extending into the substrate 105. In embodiments, the vent vias 140 extend beyond the etch stop layer 110, and can be formed using conventional CMOS processes including the use of a hardmask stack as represented by reference numeral 135. In embodiments, the hardmask stack 135 can be an oxide mask with a thickness of about 4000 Å. In embodiments, the vent vias 140 can be self-aligned to the one or more of oxide filled trenches, e.g., deep trench isolation structures 130.

Still referring to FIG. 2, the vent vias 140 will extend through the hardmask stack 135 and below the etch stop layer 110, aligned to partially overlap with shallow trench isolation regions 117. In embodiments, the vent vias 140 could also align partially with the deep trench isolation structures 130 (when the shallow trench isolation regions are not present). The vent vias 140 can be lined with a nitride or other masking material 145 (e.g., oxide based material). In embodiments, the nitride or other masking material 145 can be deposited by a conventional deposition process, e.g., CVD, followed by an anisotropic etching process to remove any of the material 145 from the bottom surface of the vent vias 140. This allows further venting or etching of the underlying substrate material 105, while protecting the hardmask stack 135 and other materials, e.g., epitaxial semiconductor layer 115, etc.

Figure 3:
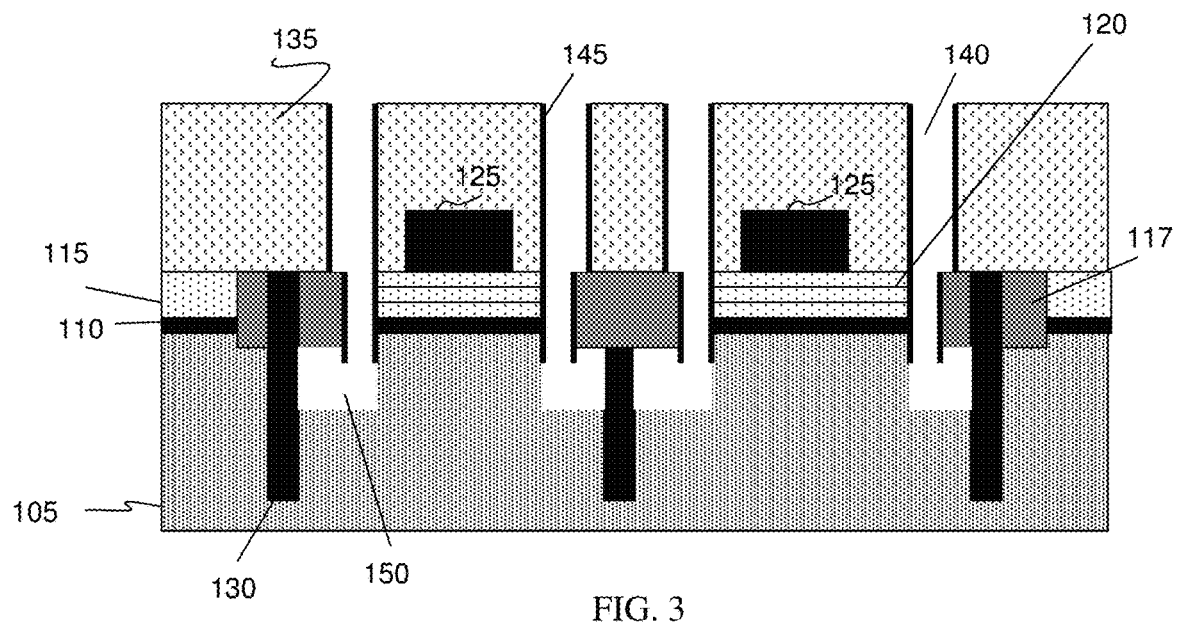
FIG. 3 shows a structure with trenches formed in an underlying substrate, amongst other features, and respective fabrication processes in accordance with additional aspects of the present disclosure.

As shown in FIG. 3, trenches 150 extend into the underlying substrate material 105, starting from the vent vias 140. In embodiments, the trenches 150 will be below the etch stop layer 110. The trenches 150 can be formed by a conventional etching process, e.g., reactive ion etching process. During this etching step, the hardmask stack 135 and other materials, e.g., epitaxial semiconductor layer 115 (and wells 120) will be protected by the nitride or other masking material 145 and the etch stop layer 110, above the substrate 105. In addition, the oxide lining or oxide fill of the deep trench isolation structures 130 will prevent any significant erosion of the deep trench isolation structures 130 during the selective etching of the substrate 105.

Figure 4:
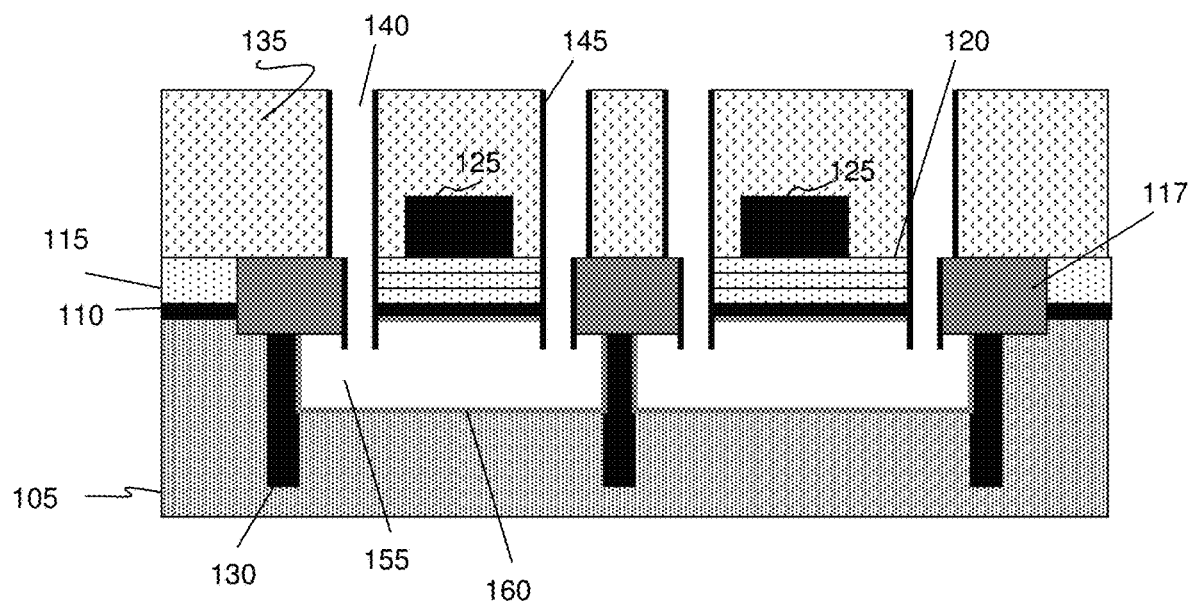
FIG. 4 shows a structure with air gaps, amongst other features, and respective fabrication processes in accordance with additional aspects of the present disclosure.

In FIG. 4, an undercut etch is performed in the substrate material 105 (through the vent vias 140) to form air gaps (cavities) 155 in the substrate material 105. Although the air gap formation is shown post PC, e.g., post gate formation, it should be understood by those of ordinary skill in the art that the air gaps 155 can be formed at other processing stages of the fabrication processes. For example, the air gaps 155 can be formed by the venting process described herein pre-PC, post PC pre silicide, post silicide, and/or post back end of the line (BEOL) dielectric deposition.

In embodiments, the air gaps 155 extend to the etch stop layer 110 and on the sides to the deep trench isolation structures 130. More specifically, the deep trench isolation structures 130 entirely surround the air gaps 155 on all sides and further extend below the depth of the air gaps 155, e.g., the deep trench isolation structures 130 should preferably be greater than 5 μm. In addition, the air gaps 155 will be self-aligned with the gate structures (e.g., below the device regions comprising switches and other FETs) and will extend laterally to the oxide filled deep trench isolation structures 130. The etch stop layer 110 will also be coincident with top of the air gaps 155, and the one or more vent vias 140 will be coincident with the air gaps 155.

As further shown in FIG. 4, the air gaps 155 can be oxidized or coated with a deposited material 160. In embodiments, the deposited material 160 can be oxide or, alternatively, oxide/polysilicon material. Moreover, in embodiments, the wells 120 can extend to the air gaps 155 with the wells still electrically isolated from the substrate 105.

Figure 5:
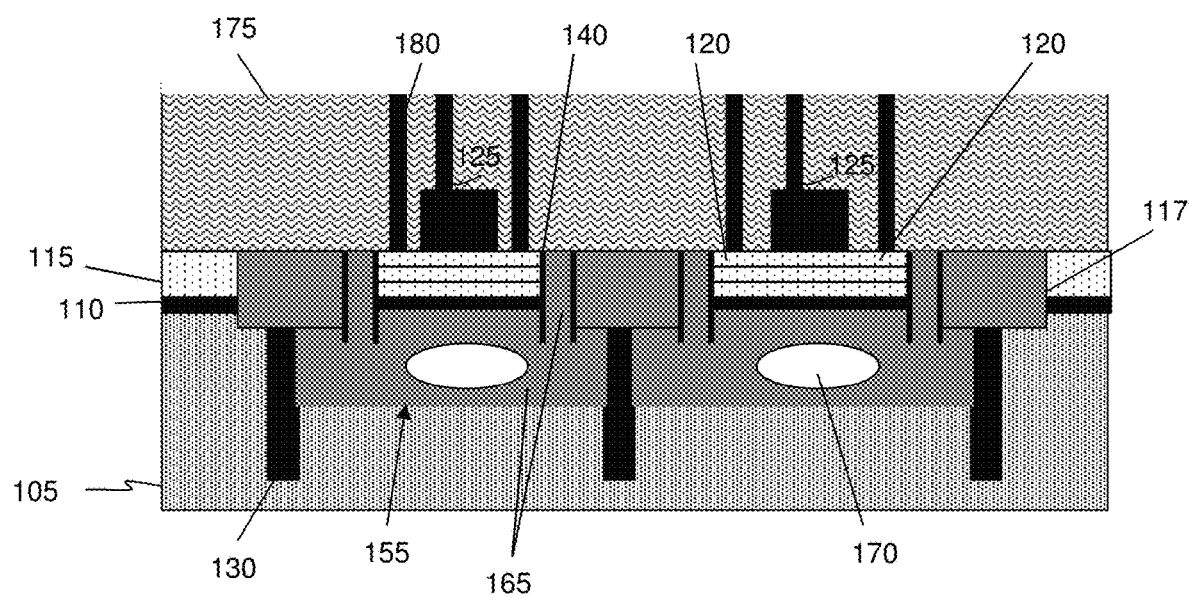
FIG. 5 shows an alternative structure and respective fabrication processes in accordance with aspects of the present disclosure.

As shown in the optional structure of FIG. 5, the air gaps or cavities 155 can be filled with an oxide or poly material 165. In embodiments, the oxide or poly material 165 can also fill the vent vias 140. In alternative embodiments, the air gaps or cavities 155 and/or the vent vias 140 can be filled with silicon or any other dielectric material. As should be understood by those of skill in the art, an air gap 170 will form when filling the air gaps 155 due to a pinch-off phenomena.

At subsequent fabrication stages, contacts 180 can be formed to the silicide regions of the gate structures and source/drain regions using conventional lithography, etching and deposition processes, within an interlevel dielectric layer 175. The contacts 180 can be any conductive material, e.g., copper, tungsten, aluminum.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a semiconductor substrate material;
an etch stop layer on an upper surface of the semiconductor substrate material;
an epitaxial material on the etch stop layer;
a device region over the epitaxial material, the device region including one or more devices;
a deep trench isolation structure surrounding the device region, extending into the semiconductor substrate material; and
a cavity within the semiconductor substrate material and under the device region, and bounded by a layer of insulator material or poly/insulator material and the etch stop layer between an epitaxial semiconductor layer and the semiconductor substrate material and on a top of the cavity and further completely surrounded by the deep trench isolation structure on all sides, the deep trench isolation structure at least partially lined with the layer of insulator material or poly/insulator material, and the etch stop layer being directly on the layer of insulator material or poly/insulator material and a top surface of the semiconductor substrate material,
wherein the layer of insulator material or poly/insulator material bounds sidewalls of the air gap, and
sidewalls of the deep trench isolation structures are in direct contact with sidewalls of the layer of insulator material or poly/insulator material.

2. The structure of claim 1, wherein the etch stop layer is SiGe and is selective to the semiconductor material.

3. The structure of claim 1, wherein the semiconductor substrate material is a high resistivity wafer.

4. The structure of claim 1, wherein the deep trench isolation structure extends into the semiconductor substrate material to a depth below a bottom surface of the cavity.

5. The structure of claim 1, further comprising a well region above the cavity, the one or more devices being formed over the well region, and the well region is a n-doped well.

6. The structure of claim 1, further comprising at least one vent via aligned with the cavity and the deep trench isolation structure, which is filled with material, and the at least one vent via is lined with a nitride material.

7. The structure of claim 1, wherein the cavity is lined with a deposited material comprising oxide/poly silicon material.

8. The structure of claim 1, further comprising vias aligned on sides of the cavity, wherein the vias extend beyond the etch stop layer and filled with material, the cavity is filled with the same material with a pinch-off air gap formed within the material within the cavity, the pinch-off air gap is under a device above the etch stop layer, the cavity and the deep trench isolation structure are located within a same layer of the same semiconductor substrate material, the vias are lined with a nitride material, and contacts are formed in direct contact with silicide regions of the device.

* * * * *